United States Patent [19]
Lai

[11] Patent Number: 5,892,389
[45] Date of Patent: Apr. 6, 1999

[54] METHOD AND CIRCUIT FOR CURRENT LIMITING OF DC-DC REGULATORS

[75] Inventor: Nelson C. Lai, Hong Kong, Hong Kong

[73] Assignee: Motorola, Inc., Schaumburg, Ill.

[21] Appl. No.: 868,337

[22] Filed: Jun. 3, 1997

[51] Int. Cl.[6] .................................................. G05F 1/10
[52] U.S. Cl. ........................ 327/543; 327/110; 361/18; 361/93; 323/277
[58] Field of Search .................................. 327/110, 427, 327/434, 538, 543; 361/18, 86, 87, 93, 94, 98; 323/276, 277, 289, 290

[56] References Cited

U.S. PATENT DOCUMENTS

| | | | |
|---|---|---|---|
| 4,429,339 | 1/1984 | Jaeschke et al. | 361/93 |
| 4,750,079 | 6/1988 | Fay et al. | 361/87 |
| 5,144,514 | 9/1992 | Sekigawa et al. | 361/18 |
| 5,222,707 | 6/1993 | Szepesi et al. | 323/222 |
| 5,282,107 | 1/1994 | Balakrishnan | 361/18 |
| 5,386,158 | 1/1995 | Wang | 327/530 |
| 5,483,182 | 1/1996 | Rybicki | 327/5 |
| 5,510,943 | 4/1996 | Fukunaga | 361/18 |
| 5,541,799 | 7/1996 | Schmidt et al. | 361/18 |

*Primary Examiner*—Timothy P. Callahan
*Assistant Examiner*—Jung Ho Kim
*Attorney, Agent, or Firm*—Sharon K. Coleman

[57] ABSTRACT

A method and circuit (10) for limiting current ($I_{COIL}$) in a load (16). The current limiting circuit (10) includes a sensing circuit (12) having a current indicator output terminal (20) connected to an inverting input of a comparator (11). A reference voltage node (24) of a reference voltage generator (13) is connected to the non-inverting input of the comparator (11). The comparator (11) generates an output signal in accordance with the current flowing in the load (16). If an overcurrent condition exists, the signal from the comparator (11) disables a control circuit (14) which turns off the sensing circuit (12). With the control circuit (14) disabled and sensing circuit (14) off, the current ($I_{COIL}$) is prevented from flowing through the load (16).

18 Claims, 1 Drawing Sheet

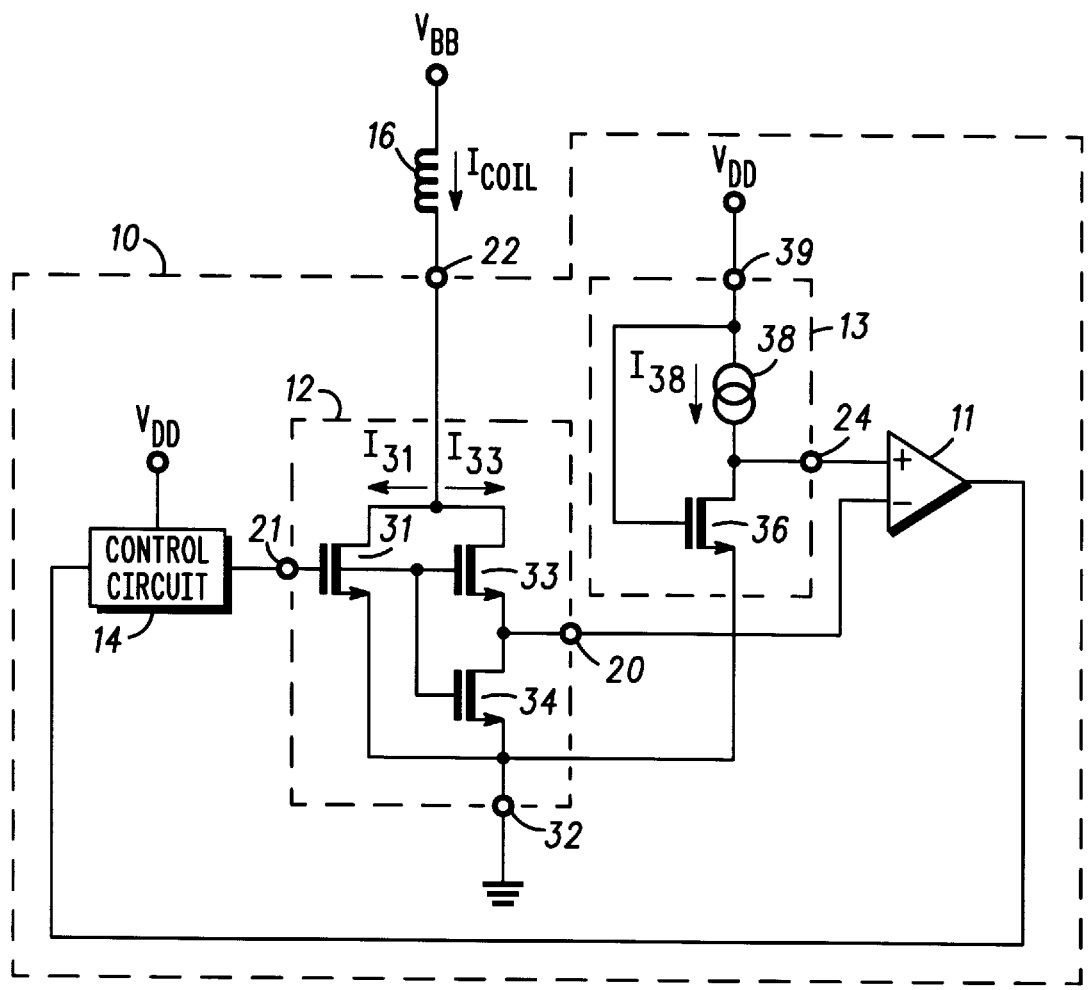

METHOD AND CIRCUIT FOR CURRENT LIMITING OF DC-DC REGULATORS

BACKGROUND OF THE INVENTION

The present invention relates, in general, to current limit circuitry and, more particularly, to current limit circuitry in DC-DC (Direct Current-Direct Current) applications.

As the consumer market drives technology to create portable devices that have extended battery life, many applications are utilizing lower voltages. Thus, many integrated circuits (ICs) are being designed to operate from low supply voltages, i.e., voltages ranging between 2.7 volts and 3.3 volts. While most of the components within these ICs can operate at low voltages, there are a few components and circuits that require higher voltages to achieve proper performance. For these ICs a boost DC-DC converter is needed. Boost converters typically include a switching transistor, a control circuit, a diode, an inductor, and a capacitor. Generally, the switching transistor, the control circuit, and the diode are monolithically integrated into a single chip, whereas the inductor and the capacitor are off-chip components.

As is known, many DC-DC converters and regulators include current limiting circuits. One such current limiting circuit incorporates a resistor in series with the switching transistor to establish a current-referenced voltage. This voltage is compared with a reference voltage such that when it exceeds the reference voltage, the DC-DC converter is exceeding a predetermined maximum current. Another type of current-limiting circuit incorporates a current sensing transistor which senses the current through the switching transistor and provides a voltage representation thereof which is compared with the reference voltage described hereinbefore. While these circuits can monitor current in the circuit, the first approach reduces the overall efficiency of the DC-DC converter due to power losses. On the other hand, the sensing transistor with a resistor in series can create an accuracy problem due variations in the gate-to-source bias voltage.

Accordingly, it would be advantageous to have a current limiting circuit and a method for limiting current in a DC-DC circuit. It would be of further advantage for the current limiting circuit to be insensitive to variations in temperature, process, and threshold voltage of the switching transistor and the sensing transistor.

BRIEF DESCRIPTION OF THE DRAWING

The sole FIGURE is a schematic of a circuit in accordance with the present invention.

DETAILED DESCRIPTION OF THE DRAWINGS

Generally, the present invention provides a method and apparatus for a DC-DC regulator current-limiting circuit. More particularly, a current sensing circuit generates a current sense output signal that is compared with a reference voltage. If the current sense output signal is less than the reference voltage, the current sensing circuit senses an undercurrent condition. During an undercurrent condition, a control circuit is enabled which thereby turns on or keeps on the current sensing circuit. However, if the current sense output signal is greater than the reference voltage, the current sense circuit senses an overcurrent condition. Thus, the control circuit is disabled thereby disabling the current sense circuit and preventing the overcurrent from flowing through the load and damaging the load. Where an inductive load is used, disabling the control circuit prevents saturation of the inductive load.

The sole FIGURE is a schematic diagram of a current limit circuit 10 in accordance with the present invention. Current limit circuit 10 includes a comparator 11, a current sensing circuit 12, a reference voltage generator 13, and a control circuit 14. In particular, comparator 11 has an inverting input (−) connected to a current indicator output 20 of current sensing circuit 12 and a non-inverting input (+) connected to reference voltage generator 13. An output of comparator 11 is coupled to an enable input 21 of current sensing circuit 12 via control circuit 14. Thus, comparator 11 cooperates with control circuit 14 to form a feedback loop. Further, a load input 22 of current sensing circuit 12 is preferably coupled to a supply voltage $V_{BB}$ via an inductive load 16 such as, for example, a coil.

Current sensing circuit 12 includes a switch transistor 31 coupled to a sensing transistor 33, and a level shift transistor 34. Switch transistor 31 has a drain coupled to load input 22 and a source connected to a power supply terminal 32. Preferably, load input 22 is coupled to supply voltage $V_{BB}$ via coil 16 and power supply terminal 32 is coupled to receive a power supply voltage $V_{EE}$. By way of example, power supply voltage $V_{BB}$ can be as low as approximately 0.9 volts and power supply voltage $V_{EE}$ is at 0 volts, i.e., power supply voltage $V_{EE}$ is at ground.

Sensing transistor 33 has a drain commonly connected to the drain of switch transistor 31 and, for example, to coil 16. A source of sensing transistor 33 is commonly connected to a drain of level shift transistor 34 and to the inverting input (−) of comparator 11. A source of level shift transistor 34 is connected to power supply terminal 32 and a gate of level shift transistor 34 is commonly connected to the gate of sensing transistor 33 and to the gate of switch transistor 31. The common connection of the source of sensing transistor 33, the drain of level shift transistor 34, and the inverting input (−) of comparator 11 forms a node which coincides with current indicator output 20.

Reference voltage generator 13 includes a reference transistor 36 coupled to a current source 38. A source of reference transistor 36 is connected to power supply terminal 32. A gate of reference transistor 36 is connected to a first terminal of current source 38 and a drain of reference transistor 36 is commonly connected to a second terminal of current source 38 and the noninverting input (+) of comparator 11. The common connection of the drain of transistor 36, second terminal of current source 38, and the noninverting input (+) of comparator 11 form a node 24. The first terminal of current source 38 and the gate of reference transistor 36 are coupled to a power supply terminal 39, which is coupled to receive a voltage $V_{DD}$. Preferably, current source 38 is a zero temperature coefficient current source that outputs a current $I_{38}$. By way of example, voltage $V_{DD}$ may be as low as approximately two (2) volts.

As described hereinbefore, the output of comparator 11 is coupled to enable input 21 of current sensing circuit 12 via control circuit 14. Preferably, control circuit 14 is a pulse width modulation control circuit. Other types of control circuits include, pulse frequency modulator (PFM) control circuits, error amplifier controls circuits, and the like. Control circuit 14 includes a power supply terminal for coupling to supply voltage $V_{DD}$.

Although transistors 31, 33, 34, and 36 have been shown and described as n-channel enhancement mode field effect transistors, it should be understood this is not a limitation of the present invention. In other words, transistors 31, 33, 34, and 36 may be n-channel depletion mode field effect transistors, NPN bipolar transistors, or the like. Moreover, by making minor modifications commonly known and used by those skilled the art to account for differences in supply voltages, operating characteristics, and the like, transistors 31, 33, 34, and 36 may be p-channel enhancement mode field effect transistors, p-channel depletion mode field effect transistors, PNP bipolar transistors, or the like. It should be further understood that the gate of a field effect transistor and the base of a bipolar transistor are referred to as a control electrodes, and the source and drains of field effect transistors and the collectors and emitters of bipolar transistors are referred to as current carrying electrodes.

Preferably, transistors 31, 33, 34, and 36 are n-channel Metal Oxide Semiconductor Field Effect Transistors (MOSFETS) having width to length ratios (M) selected to set the on-resistance ($Rds_{on}$) of each transistor to a desired value. In accordance with a first embodiment of the present invention, transistors 31, 33, and 34 are designed such that the on-resistances of transistors 31, 33, and 34, i.e., $Rds_{on31}$, $Rds_{on33}$, and $Rds_{on34}$, respectively, are selected so that the ratio of $Rds_{on31}$ to the sum of $Rds_{on33}$ and $Rds_{on34}$ is approximately 1:100. In other words, $Rds_{on31}$ ($Rds_{on33}$+$Rds_{on34}$) is approximately 1:100. In another embodiment, the on-resistances of transistors 31, 33, and 34 are selected as described with respect to the first embodiment and, in addition, the ratio of the on-resistances of transistors 34 to 36 are selected so that the ratio of $Rds_{on34}$ to $Rds_{on36}$ is approximately 1:500, i.e., $Rds_{on34}$:$Rds_{on36}$ is approximately 1:500.

In operation, voltage reference circuit 13 generates a reference voltage that appears at the non-inverting input (+) of comparator 11. Likewise, current sensing circuit 12 generates a current indicator voltage at the inverting input (−) of comparator 11. If the indicator voltage is less than the reference voltage, comparator 11 transmits an enable signal to control circuit 14 which allows control circuit 14 to regulate the output voltage. However, if the current indicator voltage is greater than the reference voltage, comparator 11 transmits a disable signal to control circuit 14. In response to the disable signal, control circuit 14 turns off transistors 31, 33, and 34 of current limit circuit 12. When transistors 31, 33, and 34 are off, current $I_{COIL}$ does not flow through coil 16, thereby preventing an overcurrent in coil 16, which in turn prevents coil 16 from becoming saturated.

The operation of current limit circuit 10 will now be described in greater detail. When a control signal from control circuit 14 is sufficiently high to turn transistors 31, 33, and 34 on, a coil current $I_{COIL}$ flows through and charges coil 16. In accordance with the first and second embodiments, a portion $I_{31}$ of coil current $I_{COIL}$ flows through transistor 31 and a portion $I_{33}$ of coil current $I_{COIL}$ flows through transistors 33 and 34. It should be noted that the sum of currents $I_{31}$ and $I_{33}$ is equal to $I_{COIL}$. Because of the on-resistances of transistors 31, 33, and 34, one unit of current flows through transistors 33 and 34 for every hundred units of current flowing through transistor 31. For example, if transistors 31, 33, and 34 are designed such that $Rds_{on31}$ is 1 ohm ($\Omega$), $Rds_{on33}$ is 60$\Omega$, $Rds_{on34}$ is 40$\Omega$, and $I_{COIL}$ is approximately 101 milliamperes (mA), then $I_{31}$ and $I_{33}$ will be 100 mA and 1 mA, respectively. Thus, a voltage appearing at current indicator output 20 is approximately 40 millivolts (mV).

Further, if $Rds_{on36}$ is 20 kilohms (k$\Omega$) and current source 38 outputs a current $I_{38}$ of approximately 2 microamperes ($\mu$A), the reference voltage appearing at the non-inverting input of comparator 11 will be approximately 40 mV. Thus, comparator 11 will transmit an enable signal to control circuit 14. On the other hand, if current $I_{COIL}$ flowing through coil 16 increases, the voltage appearing at current indicator output 20 also increases and becomes greater than the reference voltage. Comparator 11 then disables control circuit 14 to turn transistors 31, 33, and 34 off.

By selecting the desired on-resistance ratios for transistors 31, 33, 34, and 36 for a particular application, the present invention provides an accurate current limit circuit that is insensitive to variations in temperature, process, and threshold voltage. More particularly, current limit circuit 10 is insensitive to changes or variations in $V_{DD}$. Changes or variations in $V_{DD}$ cause changes or variations in the threshold voltages and a corresponding change or variation in the on-resistances of the transistors. By coupling each gate of transistors 31, 33, 34 (via control circuit 14), and 36 to $V_{DD}$, changes or variations in $V_{DD}$ affect each transistor ratiometrically, making current limit circuit 10 insensitive to variations in the bias voltage. Similarly, the common coupling of transistor gates and connection to a common bias voltage make current limit circuit 10 insensitive to temperature and process variations.

By now it should be appreciated that a method and a circuit have been provided for detecting overcurrent conditions in the load and limiting the current. In accordance with the present invention, a load current is monitored using a ratio of on-resistances of transistors having commonly connected gates. Because the gates of current sensing circuit 12 are commonly connected and because current sensing circuit 12 and reference voltage generator 13 couple to supply voltage $V_{DD}$, the on-resistances of transistor 31, 33, 34, and 36 are independent of temperature, bias supply variation, and processing parameters. Although the on-resistances may vary for each of the transistors, they vary ratiometrically. Hence, the relative current flow through each portion of the circuit varies ratiometrically. The current is used to generate an overcurrent sense voltage, which is compared to a reference voltage. Preferably, the reference voltage is generated by a high precision reference voltage generator. To further improve the accuracy of the current limit circuit, the voltage reference circuit includes a zero temperature coefficient (zero-TC) current source and a transistor having an on-resistance that varies ratiometrically with the on-resistances of the current sense circuit. Thus, the current limit circuit of the present invention provides a highly precise means for limiting an overcurrent in a load, wherein the circuit is independent of temperature, supply, and process variation.

I claim:

1. A current limiting circuit, comprising:

a first transistor having a control electrode, first and second current carrying electrodes, and an on-resistance;

a second transistor having a control electrode, first and second current carrying electrodes and an on-resistance, wherein the first current carrying electrode of the second transistor is coupled to the first current carrying electrode of the first transistor, and the control electrode of the second transistor is coupled to the control electrode of the first transistor;

a third transistor having a control electrode coupled to the control electrodes of the first and second transistors, a first current carrying electrode coupled to the second current carrying electrode of the second transistor, and an on-resistance;

a comparator having first and second inputs and an output, wherein the first input is coupled to the first current carrying electrode of the third transistor and the output is coupled to the control electrode of the first transistor;

a reference transistor having a control electrode, first and second current carrying electrodes, and an on-resistance, wherein the first current carrying electrode is coupled to the second input of the comparator; and a current source having first and second terminals, wherein the second terminal is coupled to the first current carrying electrode of the reference transistor.

2. The current limiting circuit of claim 1, wherein the current source is a zero temperature coefficient current source.

3. The current limiting circuit of claim 1, wherein the second current carrying electrodes of the first, third, and reference transistors are coupled to a first power supply terminal.

4. The current limiting circuit of claim 3, wherein the control electrode of the reference transistor and the first terminal of the current source are coupled to a second power supply terminal.

5. The current limiting circuit of claim 1, wherein a ratio of the on-resistance of the first transistor to a sum of the on-resistances of the second and third transistors is at least 1:80.

6. The current limiting circuit of claim 5, wherein the on-resistance of the third transistor to the on-resistance of the reference transistor is at least 1:400.

7. The current limiting circuit of claim 1, wherein the first, second, third, and reference transistors are field effect transistors.

8. The current limiting circuit of claim 7, wherein the field effect transistors are N-channel field effect transistors.

9. The current limiting circuit of claim 1, further including a pulse width modulation control circuit having an input and an output, wherein the input of the pulse width modulation circuit is coupled to the output of the comparator and the output of the pulse width modulation circuit is coupled to the control electrode of the first transistor.

10. The current limiting circuit of claim 1, further including a power supply terminal coupled to the first current carrying electrodes of the first and second transistors via an inductor.

11. An on-chip DC-DC regulator, comprising:

means for limiting current, wherein the means for limiting current includes:

a first transistor having a control electrode and first and second current carrying electrodes;

a second transistor having a control electrode and first and second current carrying electrodes, wherein the first current carrying electrodes of the first and second transistors are commonly coupled; and a third transistor having a control electrode and first and second current carrying electrodes, wherein the first current carrying electrode of the third transistor is coupled to the second current carrying electrode of the second transistor, and the control electrodes of the first, second, and third transistors are commonly connected;

a comparator having first and second inputs and an output, wherein the first input is coupled to the means for limiting current;

a reference voltage generator coupled to the second input of the comparator; and a control circuit coupled between the comparator and the means for limiting current.

12. The on-chip DC-DC regulator of claim 11, wherein the reference voltage generator includes:

a reference transistor having a control electrode, a first current carrying electrode, and a second current carrying electrode, wherein the first current carrying electrode is coupled to the second input of the comparator; and a current source having first and second terminals, wherein the second terminal is coupled to the first current carrying electrode of the reference transistor.

13. The on-chip DC-DC regulator of claim 11, wherein the control circuit is a pulse width modulation control circuit.

14. The on-chip DC-DC regulator of claim 12, wherein the current source is a zero temperature coefficient current source.

15. The on-chip DC-DC regulator of claim 11, wherein the reference voltage generator includes a reference transistor having a control electrode, a first current carrying electrode, and a second current carrying electrode, wherein the first current carrying electrode is coupled to the second input of the comparator.

16. The on-chip DC-DC regulator of claim 15, wherein a ratio of an on-resistance of the first transistor to a sum of an on-resistance of the second transistor and an on-resistance of the third transistor is set to a first predetermined ratio and a ratio of the on-resistance of the third transistor to an on-resistance of the reference transistor is set to a second predetermined ratio.

17. The on-chip DC-DC regulator of claim 16, wherein the first predetermined ratio is 1:100 and the second predetermined ratio is 1:500.

18. The on-chip DC-DC regulator of claim 11, further including a coil coupled to the first current carrying electrodes of the first and second transistors.

* * * * *